(12) United States Patent
Tsukashima

(10) Patent No.: US 7,067,743 B2
(45) Date of Patent: Jun. 27, 2006

(54) TRANSMISSION LINE AND DEVICE INCLUDING THE SAME

(75) Inventor: Koji Tsukashima, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 247 days.

(21) Appl. No.: 10/663,661

(22) Filed: Sep. 17, 2003

(65) Prior Publication Data

US 2004/0050587 A1    Mar. 18, 2004

(30) Foreign Application Priority Data

Sep. 17, 2002   (JP)   ............... 2002-270037

(51) Int. Cl.
*H01R 12/04*   (2006.01)
(52) U.S. Cl. ..................... 174/261; 174/262
(58) Field of Classification Search ............... 174/255, 174/261, 262; 361/777; 333/33
See application file for complete search history.

(56) References Cited

U.S. PATENT DOCUMENTS 5,057,805 A * 10/1991 Kadowaki .................. 333/247
5,495,125 A * 2/1996 Uemura ..................... 257/666
6,473,314 B1 * 10/2002 Custer et al. ............... 361/818
2002/0074162 A1 * 6/2002 Su et al. ..................... 174/262

FOREIGN PATENT DOCUMENTS

| JP | 04-117702 | 4/1992 |
| JP | 04-227101 | 8/1992 |
| JP | 04-336702 | 11/1992 |
| JP | 06-310917 | 11/1994 |

OTHER PUBLICATIONS

Japanese Office Action dated Aug. 16, 2005 (No translation provided).

* cited by examiner

*Primary Examiner*—Kamand Cuneo
*Assistant Examiner*—Yuriy Semenenko
(74) *Attorney, Agent, or Firm*—Westerman, Hattori, Daniels & Adrian, LLP.

(57) ABSTRACT

A transmission line includes a transmission line substrate, a signal line, and a first ground pattern that is provided on the transmission line substrate and is located between the transmission line substrate and a metal wire used to connect the signal line to a component.

15 Claims, 6 Drawing Sheets

TRANSMISSION LINE AND DEVICE INCLUDING THE SAME

BACKGROUND OF THE INVENTION

1. Field of the Invention

The present invention relates to a transmission line and a device that includes the transmission line, and more particularly, a transmission line that is connected to a semiconductor device and a device including the transmission line.

2. Description of the Related Art

FIG. 1A shows a plan view of an interface at which pads 11 of an electric component 10 such as a semiconductor device are connected to a transmission line 20 by metal wires 31 such as gold wires (or gold ribbons). The transmission line 20 is of a coplanar type.

FIG. 1B is a cross-sectional view taken along a line A–A' shown in FIG. 1A, and FIG. 1C is an equivalent circuit of the circuit configuration shown in FIG. 1A. The use of the metal wires 31 results in an electric capacitance between the metal wires and a metal frame 30 on which the component 10 and the transmission line 20 are formed. Symbols L1 and L2 are inductances of the metal wires 31, and Ld is an inductance of the transmission line 20.

In general, the capacitance C1 is much smaller than an electric capacitance Cd (C1<<Cd) on the side of the transmission line 20. This causes discontinuity of impedance between the component 10 and the transmission line 20. This kind of problem occurs in not only the coplanar type transmission line but also a transmission line of microstrip type.

SUMMARY OF THE INVENTION

It is an object of the present invention to provide a transmission line and a device including the transmission line in which the above problems are eliminated.

A more specific object of the present invention is to provide a transmission line and a device using the same in which impedance discontinuity caused between a component and the transmission line is reduced.

The above objects of the present invention are achieved by a transmission line comprising: a transmission line substrate; a signal line; and a first ground pattern that is provided on the transmission line substrate and is located between the transmission line substrate and a metal wire used to connect the signal line to a component.

The above objects of the present invention are also achieved by a transmission line comprising: a transmission line substrate; a signal line; and a first ground pattern provided on a side surface of the transmission line substrate on which side a metal wire extends from the signal line toward a component.

The above objects of the present invention are also achieved by a transmission line comprising: a transmission line substrate; a signal line; and means for adding a predetermined electric capacitance to a metal wire that connects the signal line to a component.

The above objects of the present invention are also achieved by a device comprising: a transmission line including a transmission line substrate and a signal line provided on the transmission line substrate; a component; a metal wire connecting the signal line to the component; and a first ground pattern that is provided on the transmission line substrate and is located between the transmission line substrate and the metal wire.

The above objects of the present invention are also achieved by a device comprising: a transmission line including a transmission line substrate and a signal line provided on the transmission line substrate; a component; a metal wire which connects the signal line to the component; and a first ground pattern provided on a side surface of the transmission line substrate on which side a metal wire extends from the signal line toward a component.

The above objects of the present invention are also achieved by a device comprising: a transmission line including a transmission line substrate and a signal line formed on the transmission line substrate; a component; a metal wire which connects the signal line to the semiconductor device; and means for adding a predetermined electric capacitance to the metal wire.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1A:
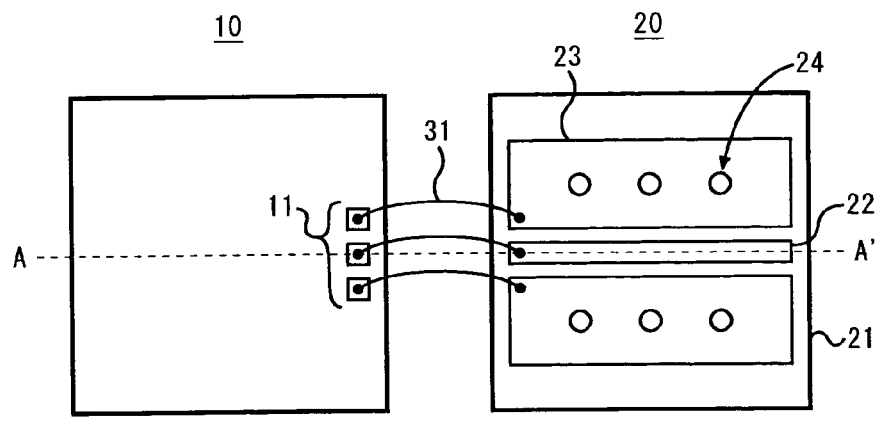
FIG. 1A is a plan view of a conventional transmission line connected to a component.

Referring now to the drawings, a description will be given of preferred embodiments of the present invention with reference to the accompanying drawings.

First Embodiment

A first embodiment of the present invention employs a coplanar type transmission line.

Figure 1B:
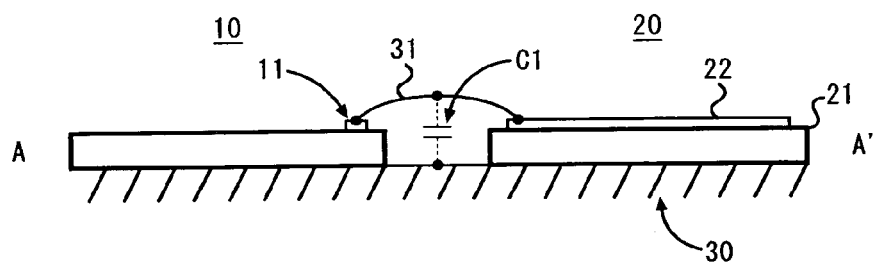
FIG. 1B is a cross-sectional view taken along a line A–A' shown in FIG. 1A.
Figure 1C:
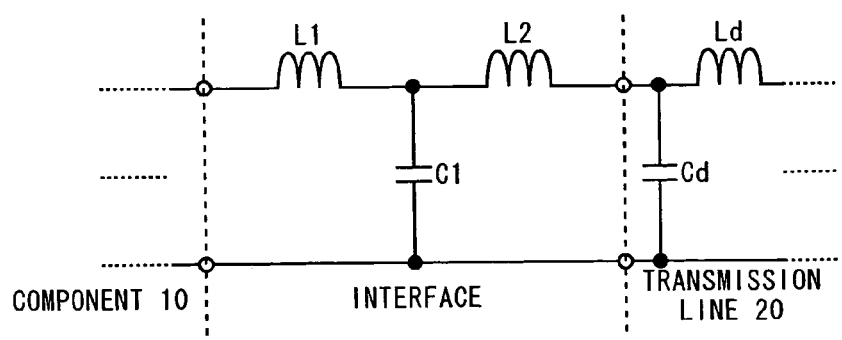
FIG. 1C is an equivalent circuit diagram of the arrangement shown in FIG. 1A.
Figure 2A:
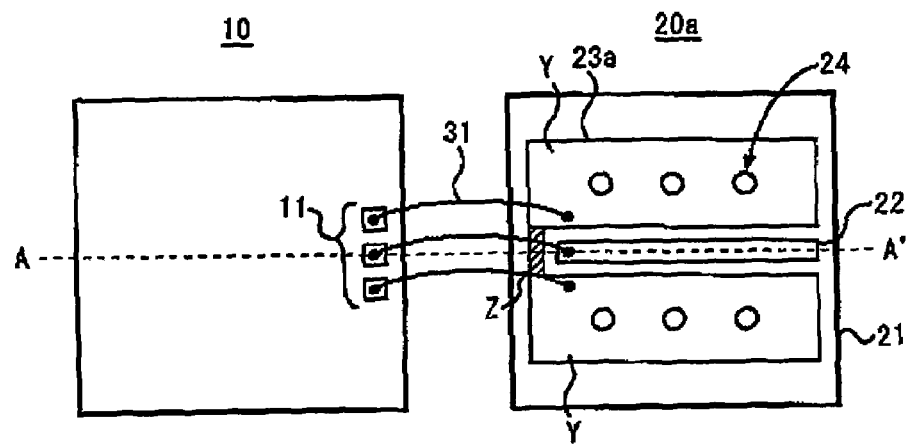
FIG. 2A is a plan view of a transmission line connected to a component according to a first embodiment of the present invention.

FIG. 2A is a plan view of a device with a transmission line 20a according to the first embodiment of the present invention, in which parts that are the same as those shown in FIGS. 1A through 1C are given the same reference numerals. The component 10 and the transmission line 20a are disposed a predetermined distance apart. A signal line 22 and a ground pattern 23a of the transmission line 20a are connected to the pads 11 of the component 10 through metal wires 31 made of, for example, gold. The distance between the component 10 and the transmission line 20a depends on a design condition of the device. In this respect, it is possible to decrease the inductance of the metal wires 31 by setting the distance between the component 10 and the transmission line 20a as short as possible. By such an arrangement, it is possible to alleviate design demands of the metal wiring and the transmission line 20a. Furthermore, as the metal wires become shorter, they have reduced inductance, so that impedance discontinuity can be reduced.

The metal wires 31 may be gold wires or gold ribbons. The component 10 may be one of various types of semiconductor devices such as a switch, a mixer and an amplifier. The component employed in the first embodiment of the invention is a semiconductor device capable of operating at high-frequency (RF). The coplanar type transmission line 20a has a structure in which the signal line 22 and the ground pattern 23a associated with the signal line 22 are formed on a transmission line substrate 21 made of a dielectric material.

Figure 2B:
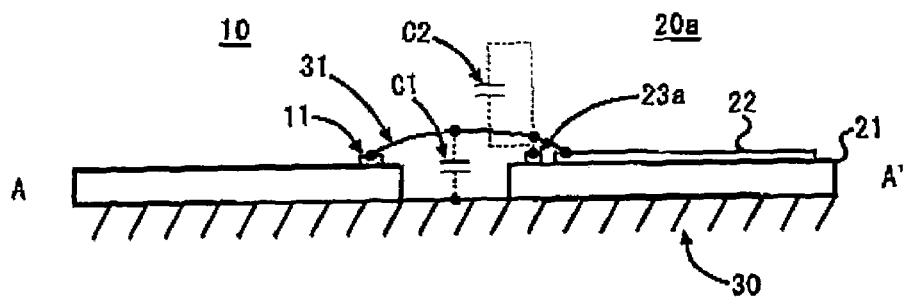
FIG. 2B is a cross-sectional view taken along a line A–A' shown in FIG. 2A.

The ground pattern 23a includes two portions (hereinafter referred to as portions Y) and a portion Z on the transmission line substrate 21. The portions Y run in parallel with the signal line 22. The portion Z connects two ends of the portions Y and runs below the metal wire 31 bonded to the signal line 22 so as to cross the signal line 22. The portion Z on the signal transmission substrate 21 is located between the signal line 22 and the component 10. The parallel portions Y of the ground pattern 23a are of an ordinary coplanar type ground patterns. The portion Z has a unique structure in the present embodiment. The portion Z of the ground pattern 23a forms an electric capacitance C2 between the portion Z and the metal wire 31 that extends from the signal line 22, as shown in FIG. 2B, which is a cross-sectional view taken along the line A–A' shown in FIG. 2A.

Figure 2C:
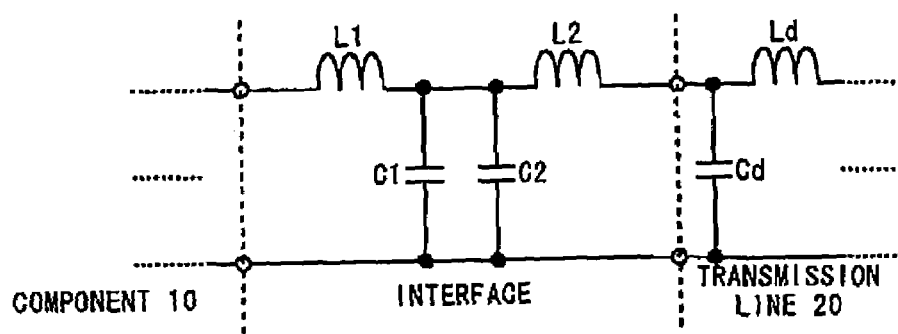
FIG. 2C is an equivalent circuit diagram of the arrangement shown in FIG. 2A.

The capacitance C2 is connected in parallel with the capacitance C1 formed between the metal wire 31 and frame 30, as shown in FIG. 2C. When the capacitance C2 is designed to have a value that makes the composite capacitance C1+C2 equal to the capacitance Cd of the transmission line 20a, impedance matching between the interface and the transmission line 20a can be improved. In FIG. 2C, L1 and L2 represent inductances of the metal wire 31, and Ld represents the inductance of the transmission line 20a.

The portion Z of the ground pattern 23a also functions to reduce influence over the signal line 22 caused by unnecessary radiation from the pads 11 that are not connected to the signal line 22.

The portions Y and Z of the ground pattern 23a make a right angle and are integrally formed in one piece so as to have a horseshoe shape. The ground pattern 23a does not need a particular process, and does not cause a potential difference between the parallel ground portions Y. Since the portions Y are at an identical potential, there is no interference and no impedance mismatch that may be caused if there is a potential difference therebetween.

The ground pattern 23a as described above is electrically connected to the frame 30 through one or more through holes 24 as shown in FIG. 2A. The frame 30 is placed on the surface of the transmission line substrate 21 opposite to the other surface on which the signal line 22 is disposed. The through holes 24 penetrate through the transmission line substrate 21 and connect the opposing surfaces thereof. The frame 30 may be made of a metal, and is grounded. The ground pattern 23a is electrically connected to the frame through the through holes 24, and is thus grounded.

The portions Y and Z of the ground pattern 23a in FIG. 2A may be separated from each other. In this case, the separate portions Y and Z should be connected to the frame 30 by the through holes 24 respectively provided for each portion. The capacitance C2 thus formed is designed to have a value that makes the composite capacitance C1+C2 equal to the capacitance Cd of the transmission line 20a. It is therefore possible to improve the impedance matching between the interface and the transmission line 20a and to reduce influence over the signal line 22 that can be caused by unnecessary radiation from the pads 11 that are not connected to the signal line 22.

The portions Y and Z may have yet another arrangement in which only one of the two portions Y and Z makes a right angle so that the ground pattern 23a can be integrally formed so as to have an L shape. The capacitance C2 thus formed is also designed to have a value that makes the composite capacitance C1+C2 equal to the capacitance Cd of the transmission line. It is therefore possible to improve the impedance matching between the interface and the transmission line and to reduce influence over the signal line 22 that can be caused by unnecessary radiation from the pads 11 that are not connected to the signal line 22.

Figure 3:
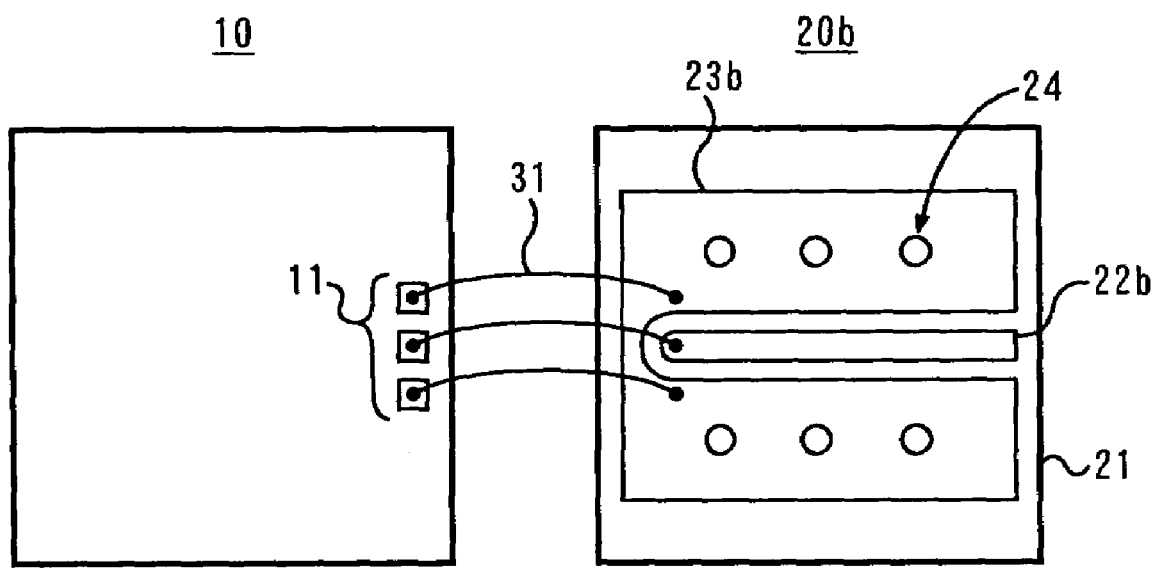
FIG. 3 is a plan view of a transmission line connected to a component according to a second embodiment of the present invention.

FIG. 3 shows a device with a transmission line according to a second embodiment of the present invention. A ground pattern 23b is evenly spaced apart from a signal line 22b. In other words, the distance or spacing between the ground pattern 23b and the signal line 22b is fixed at any point. In order to achieve the fixed distance, the inner edge of the ground pattern 23b has an arc shape, and the signal line 22b has a counterpart in shape. With this arrangement, it is possible to prevent the electric field formed between the signal line 22b and the ground pattern 23b from concentrating on a particular position or deviating and to thus form the even electric field. The arc shape may have a portion of a circle, an ellipse, and so on.

The ground pattern 23b and the signal line 22b are connected to the pads 11 of the component 10 by metal wires 31 that serve as an interface between the component 10 and the transmission line 20b. The end of the signal line 22b subjected to wire bonding may have a semicircular shape. The inner edge of the ground pattern 23b that surrounds the signal line 22b has a counterpart in shape so that the inner edge of the ground pattern 23b can be evenly spaced apart from the arc-shaped end of the signal line 22b.

The inner edge of the ground pattern 23b that faces the arc-shaped end of the signal line 22b may be varied. For example, the ground pattern 23b may have one or two corners, which face the end of the signal line 22b and have an arc shape. In this case, preferably, the end of the signal line 22b may have one or two corner counterparts so that the inner edge of the ground pattern 23b can be evenly spaced apart from the end of the signal line 22b.

The other portions of the second embodiment of the present invention are the same as those of the first embodiment thereof.

Third Embodiment

A device according to a third embodiment of the invention employs a microstrip line as the transmission line.

Figure 4A:
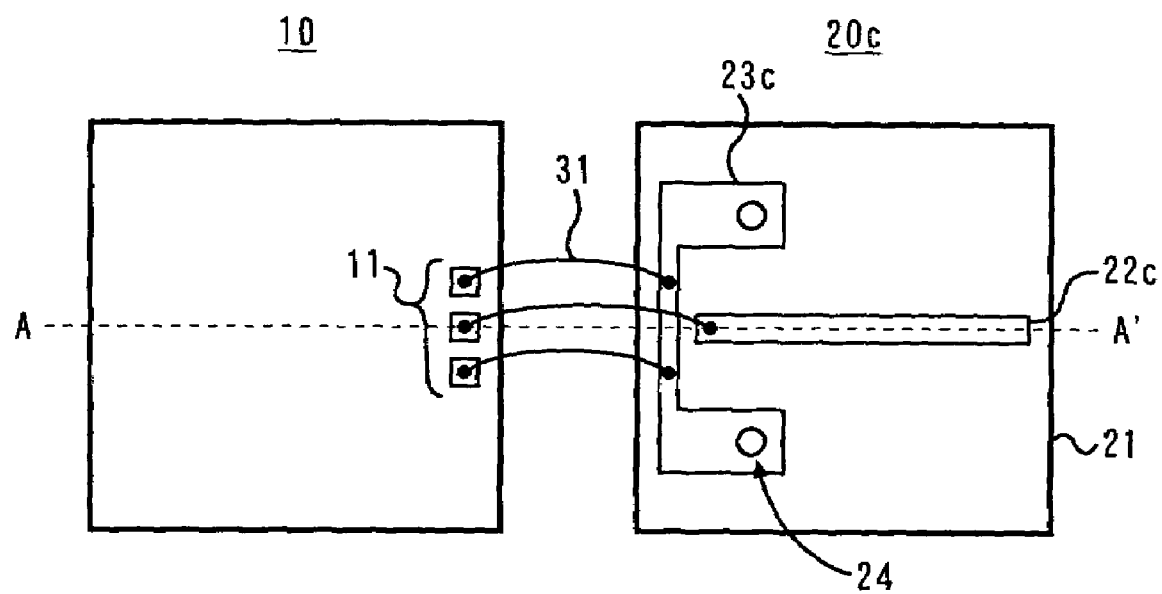
FIG. 4A is a plan view of a transmission line connected to a component according to a third embodiment of the present invention.

FIG. 4A is a plan view of a device with a transmission line 20c according to the third embodiment of the present invention. The transmission line 20c has a signal line 22c having an end to which the metal wire 31 is bonded. A ground pattern 23c formed on the signal line substrate 21 has two parallel portions and an intermediate portion connecting the parallel portions. The intermediate portion is interposed between the component 10 and the signal line 22c, and is located below the metal wire 31 that connects the signal line 22c to the pad 11 of the component 10.

This arrangement of the intermediate portion is similar to the portion B of the ground pattern 23a. The two parallel portions of the ground pattern 23c are not associated with the signal line 22c in signal transmission but are used to ground the intermediate portion that crosses the wires. The two parallel portions of the ground pattern 23c are connected via the through holes 24 to ground provided on the bottom surface of the transmission line substrate 21 opposite to the surface on which the signal line 22c is formed. Since the transmission line 20c is a microstrip line, a ground pattern 25 associated with the signal line 22c is formed on the backside of the transmission line substrate 21 opposite to the side on which the signal line 22c is formed. In other words, the two parallel portions of the ground pattern 23c serve as members that connect the intermediate portion of the ground pattern 23c to the ground pattern 25.

In FIG. 4A, the ground pattern 23c has a horseshoe shape. Alternatively, the ground pattern 23c may have a straight shape or an L shape. The L shape may be formed by the straight intermediate portion and one of the parallel portions.

Figure 4B:
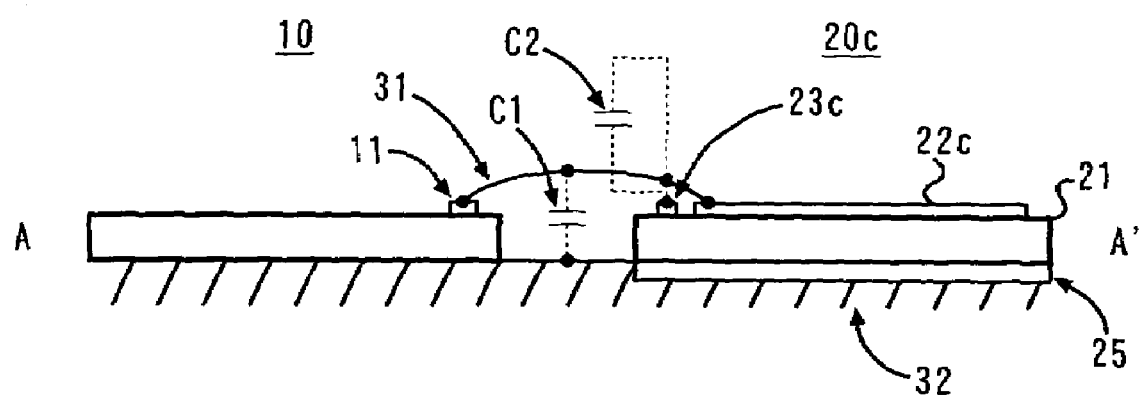
FIG. 4B is a cross-sectional view taken along a line A–A' shown in FIG. 4A.

The other portions of the device shown in FIGS. 4A and 4B are the same as those of the first embodiment of the invention.

Fourth Embodiment

According to a fourth embodiment of the invention, a ground pattern used to make additional capacitance C2 is provided on a side surface of the transmission line substrate 21.

Figure 5A:
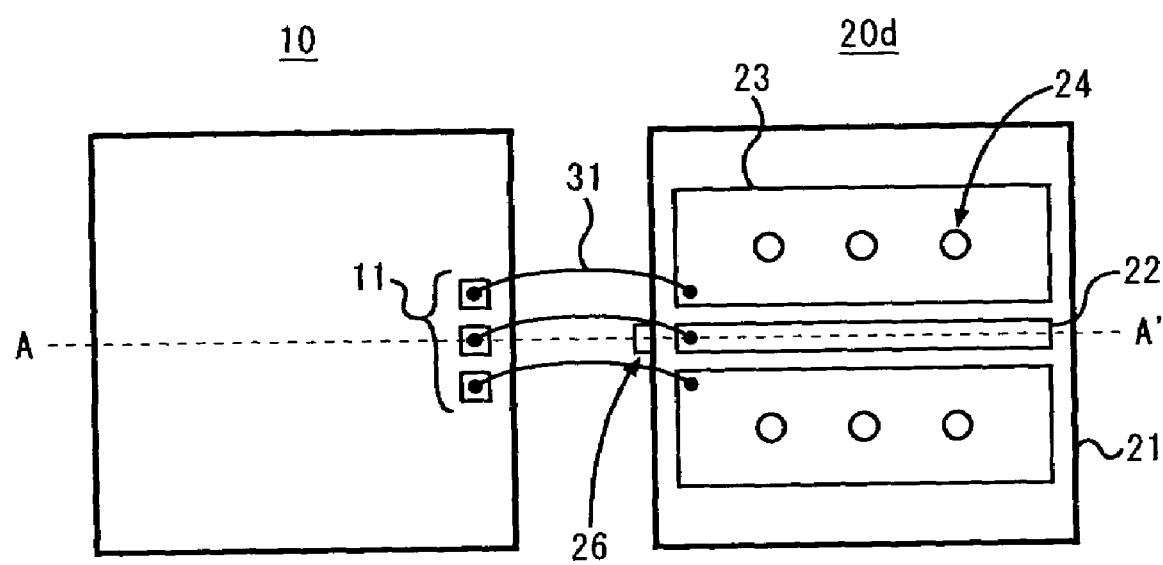
FIG. 5A is a plan view of a transmission line connected to a component according to a fourth embodiment of the present invention.
Figure 5B:
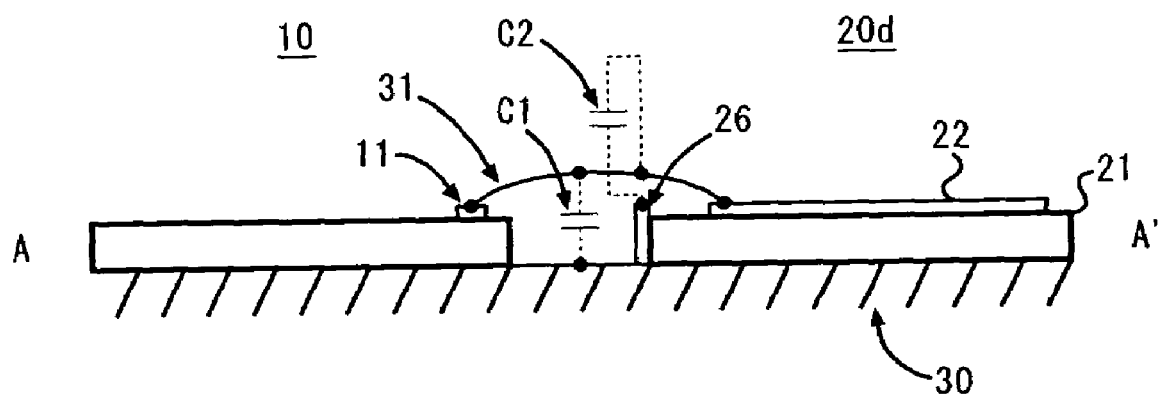
FIG. 5B is a plan view taken along a line A–A' shown in FIG. 5A.

FIG. 5A is a plan view of a device having a transmission line 20d according to the fourth embodiment of the present invention, and FIG. 5B is a cross-sectional view taken along a line A–A' shown in FIG. 5A. The transmission line 20d has the signal line 22 and a ground pattern 23 having two parallel portions on either side of the signal line 22. The two parallel portions are associated with the signal line 22 in signal transmission. The through holes 24 electrically connect the ground patterns 23 to the frame 30. A round pattern 26 for making an additional capacitance 2 that should be connected in parallel with the capacitance C1 is provided on a side surface of the signal transmission substrate 21 that faces the component 10. The ground pattern 26 is interposed between the component 10 and the transmission line 20d. The ground pattern 26 is located below the metal wire 31 that connects the signal line 22 and the corresponding pad 11 of the component 10. Hereinafter, the side surface of the transmission line substrate 21 is referred to as given side surface.

The ground pattern 26 may be partially provided on the given side surface so that it can be located below the metal wire 31 extending from the signal line 22. Alternatively, the ground pattern 26 may be provided on the whole given side surface. Also, the ground pattern 26 may extend up to the surface of the transmission line substrate 21 on which the signal line 22 is provided. The ground pattern 26 is in contact with the metal frame 30. Since the metal frame 30 is grounded, the ground pattern 26 is constantly at the ground potential. The capacitance C2 is formed between the ground pattern 26 and the metal wire extending from the signal line 22. The capacitance C2 is connected in parallel with the capacitance C1 formed between the metal wire 31 and the frame 30. The capacitance C2 is designed to have a value that makes the composite capacitance C1+C2 equal to the electrostatic capacitance Cd of the transmission line 20d. Thus, the fourth embodiment of the invention has the same effects as those of the aforementioned first embodiment. The other portions of the present embodiment are the same as those of the first embodiment.

Fifth Embodiment

Figure 6A:
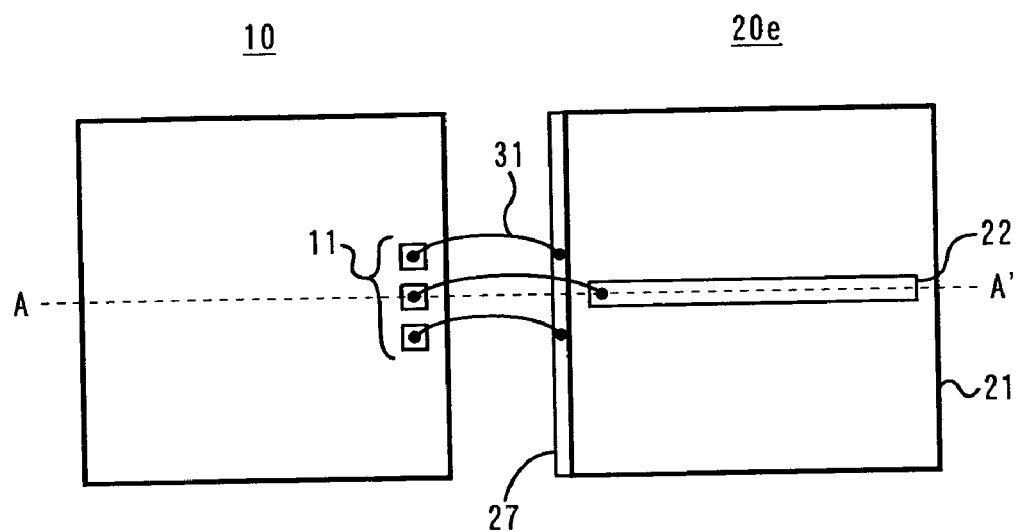
FIG. 6A is a plan view of a transmission line connected to a component according to a fifth embodiment of the present invention.

A fifth embodiment of the present invention is an application of the concept of the fourth embodiment to a microstrip type transmission line. A ground pattern 27 is provided on a side surface of a transmission line substrate 21 of microstrip line type. This side surface of the transmission line 20e faces the component 10. In FIG. 6A, the ground pattern 27 is provided on the whole side surface of the transmission line substrate 21. Alternatively, the ground pattern 27 may be provided on a part of the side surface of the transmission line substrate 21. Preferably, the ground pattern 27 should be located under the metal wire 31 extending from the signal line 22. The ground pattern 27 is connected to the corresponding pads 11 of the component 10 by wires.

Figure 6B:
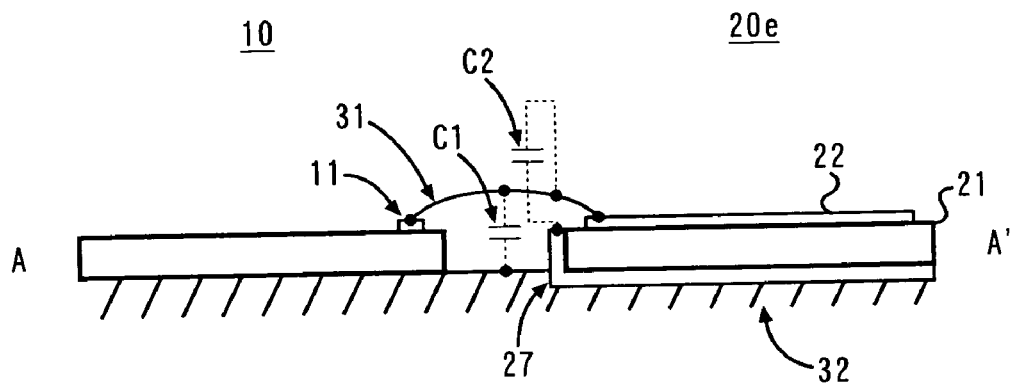
FIG. 6B is a cross-sectional view taken along a line A–A' shown in FIG. 6A.

As shown in FIG. 6B, the ground pattern 27 is integrally formed with the ground pattern provided on the backside of the transmission line substrate 21.

As described above, in accordance with the present invention, the electric capacitance is added to the metal wire, which capacitance contributes to reducing impedance discontinuity between the component and the transmission line. The additional ground pattern provided between the component and the transmission line reduces influence of radiation over the signal line from pads on the component that are not connected to the signal line. The additional ground pattern may be integrally formed with the ground patterns involved in transmission line. This prevents a potential difference from developing between the ground patterns in transmission line and reduces impedance discontinuity between the interface and the transmission line. The integral formation of the additional ground pattern with the ground patterns associated with the signal line does not need additional production process. The arrangement in which the additional ground pattern is equally spaced apart from the signal line contributes to evenly applying the electric field to the signal line. The present invention includes not only the coplanar type transmission line but also the microstrip line type.

The present invention is not limited to the specifically described embodiments, and other embodiments, variations and modifications may be made without departing from the scope of the present invention.

The present application is based on Japanese Patent Application No. 2002-270037 filed on Sep. 17, 2002, the entire disclosure of which is hereby incorporated by reference.

What is claimed is:

1. A transmission line comprising:
 a transmission line substrate;
 a signal line provided on the transmission line substrate; and
 a first ground pattern that is provided on the transmission line substrate and is located between the transmission line substrate and a metal wire used to connect the signal line to a component, wherein said component is co-planar with said transmission line substrate and does not directly come in contact with said transmission line substrate, and both said component and said transmission line substrate are provided on a common metal frame.

2. The transmission line as claimed in claim 1, wherein the first ground pattern is located between the signal line and the component.

3. The transmission line as claimed in claim 1, further comprising a second ground pattern that is formed on the transmission line substrate and is parallel to the signal line, wherein the first ground pattern and the second ground pattern are integrally formed.

4. The transmission line as claimed in claim 3, wherein the first ground pattern and the second ground pattern are integrally formed and have one of an L shape and a horseshoe shape.

5. The transmission line as claimed in claim 3, wherein:
the signal line has an arc-shaped end facing the first ground pattern; and
the first ground pattern and the second ground pattern are integrally formed so as to have an arc-shaped portion that is equally spaced apart from the arc-shaped end.

6. The transmission line as claimed in claim 1, further comprising a second ground pattern formed on a surface of the transmission line substrate opposite to the surface on which the signal line is formed, wherein the first ground pattern is connected to the second ground pattern via a through hole formed in the transmission line substrate.

7. The transmission line as claimed in claim 6, wherein the first ground pattern has a portion that surrounds an end of the signal line and has one of an L shape and a horseshoe shape.

8. A device comprising:
a transmission line including a transmission line substrate and a signal line provided on the transmission line substrate;
a component;
a metal wire connecting the signal line to the component; and
a first ground pattern that is provided on the transmission line substrate and is located between the transmission line substrate and the metal wire,
wherein said component is co-planar with said transmission line substrate and does not directly come in contact with said transmission line substrate, and both said component and said transmission line substrate are provided on a common metal frame.

9. The device as claimed in claim 8, wherein the first ground pattern is provided between the signal line and the component.

10. The device as claimed in claim 8, further comprising a second ground pattern that is provided on the transmission line substrate and is parallel to the signal line, wherein the first ground pattern and the second ground pattern are integrally formed.

11. The device as claimed in claim 10, wherein the first ground pattern and the second ground pattern are integrally formed so as to have one of an L shape and a horseshoe shape.

12. The device as claimed in claim 10, wherein:
the signal line has an arc-shaped end facing the first ground pattern; and
the first ground pattern and the second ground pattern are integrally formed so as to have an arc-shaped portion that is equally spaced apart from the arc-shaped end.

13. The device as claimed in claim 10, wherein the second ground pattern is connected to ground via a through hole formed in the transmission line substrate.

14. The device as claimed in claim 8, further comprising a second ground pattern formed on a surface of the transmission line substrate opposite to the surface on which the signal line is formed, wherein the first ground pattern is connected to the second ground pattern via a through hole formed in the transmission line substrate.

15. The device as claimed in claim 14, wherein the first ground pattern has a portion that surrounds an end of the signal line and has one of an L shape and a horseshoe shape.

* * * * *